CONDUCTOR COMPOSITIONS FOR MICROCIRCUITRY

INVENTORS
JOHN M. WOULBROUN
DANIEL W. MASON
BY
Jack Larsen
ATTORNEY

INVENTORS
JOHN M. WOULBROUN
DANIEL W. MASON
BY
Jack Larsen
ATTORNEY

CONDUCTOR COMPOSITIONS FOR MICROCIRCUITRY

Filed Oct. 6, 1969 3 Sheets-Sheet 3

*INVENTORS*
JOHN M. WOULBROUN
DANIEL W. MASON
*BY* Jack Larsen
ATTORNEY

United States Patent Office 3,598,761 Patented Aug. 10, 1971

3,598,761

CONDUCTOR COMPOSITIONS FOR MICROCIRCUITRY

John M. Woulbroun, Lynnfield, and Daniel W. Mason, Peabody, Mass., assignors to Owens-Illinois, Inc.

Filed Oct. 6, 1969, Ser. No. 863,875
Int. Cl. H01b *1/02*; B44d *1/02*
U.S. Cl. 252—514 7 Claims

ABSTRACT OF THE DISCLOSURE

A class of conductive compositions for interconnecting parts in thick film circuits is disclosed wherein conductor paths are formed between particles of micron size which are coated with noble metal over a core with contrasting properties whereby after firing, a solderable adherent conductive body is formed which has the desirable properties of prior-art conductors of the palladium-gold type, but which contain a substantially lesser noble metal content. "Mock-metal" particles such as palladium over alumina and gold over copper are described.

This invention relates to conductor compositions for use in electrical circuits which are fired onto ceramic bodies. More particularly it relates to conductor compositions especially useful for preparing connections to or between fired-on precious and non-precious metal and oxide based circuit components, which compositions are themselves fired on in use, and improved palladium-based resistor compounds.

Fired-on resistor components are now widely used. They may be made by printing a palladium-vitreous binder composition, such as is described in D'Andrea U.S. Pat. 2,924,540 or the palladium or rhodium-oxide-based composition described in Dumesil U.S. Pat. 3,052,573, in a desired pattern onto a ceramic dielectric body or base and then firing to bond the composition to the dielectric body. Such fired-on resistors must be electrically connected to other parts, such as capacitors as described in the copending application of Wallace N. Cox Ser. No. 609,533 assigned to the prior assignee of the present application.

Silver conductor compositions have not proven to be completely satisfactory for effecting such connections because the fired-on silver tends to migrate, particularly in humid atmospheres, and silver tends to result in objectionable gas evolution in the presence of palladium.

Fired-on conductor compositions based on mixtures of platinum and gold powders in a vitreous binder have been found to be superior to silver-based compositions in that there is no metal migration or gas evolution; but they are expensive and have characteristically exhibited unsatisfactory amounts of electrical noise in circuits and inadequate adherence to a substrate unless fired at a very high temperature. Mixtures of palladium and gold powders in a vitreous binder have been found to be superior to mixtures of platinum and gold powders with binder because palladium is somewhat cheaper than platinum and fires at a somewhat lower temperature; depending on the binder system it produces connections that are especially compatible with palladium-based resistor compositions. In these compositions both the gold and the palladium contribute compatible physical, chemical, and electrical properties. The chemical and electrical properties of the noble metals are remarkable and indispensible to thick-film technology in that they oxidize slowly and reversibly at firing temperatures in air and are among the best electrical conductors. On the other hand, the noble metals are not remarkable for their strength. It is therefore an object of the present invention to provide reinforcement of the strength of the noble metal constituents of thick-film conductive and resistive compositions while retaining substantially the desirable chemical and electrical properties of prior-art noble metal compositions.

It is a further object of the invention to provide palladium-based resistor and conductor compositions, enamels and the like, with substantially reduced noble metal content, thereby to effect substantial economies in the cost of producing hybrid circuit structures using such compositions.

In the compositions of Wagner U.S. Pat. 3,347,799, palladium powder and gold powder having particle sizes ranging from about 0.01 to 10 microns with an average of about 0.2 micron are mixed with up to 30% of the solids weight of vitreous binder. An organic vehicle is added to make a screenable paste which is then fired at 760° C. for ten minutes. At this temperature there is a minimum of reaction between the gold and palladium phases. The gold provides a soft metallic component, the palladium a somewhat harder metallic component and the particles of metal are partially sintered together to form a continuous metallic network imbedded in the glass.

According to the specification of the Wagner patent and tests by the applicants, the properties of such noble metal chains are not markedly changed whether the particles are very small or relatively large with an average diameter as much as 5 microns. From a theoretical analysis of the resistance of a chain of particles sintered together at points of contact, it is immediately obvious that the resistance is controlled primarily by the points of contact and is relatively independent of the body resistance of the particles. The ability of the particles to sinter together and the solderability of the resulting composition are likewise due in large part to the surface properties of the particles.

A feature of the present invention is the employment of particles coated with noble metals to be mixed with a vitreous binder, with or without other particles. The cores of the coated particles may be a hard material which is a non-conductor of electricity or it may be metal, even a relatively soft metal such as copper. It is preferred that some of the particles in a given composition have a relatively soft core as an aid to forming good contacts in sintering. A conductor composition in accordance with the invention may comprise a powder containing less than 8% palladium coated on an approximately equal weight percent of alumina particles of about one micron (0.1–10$\mu$) average diameter mixed with a powder less than 30% by weight of gold plated over about 30% by weight of copper, the remaining 24% solid content being a suitable vitreous frit.

By a suitable choice of the reinforcing core materials, noble-metal-based, fired-on conductors can be made to have any desired coefficient of thermal expansion either less than or greater than the thermal coefficient of expansion of the prior art resistors which have up to 90% by weight of noble metals in their composition and have a thermal coefficient of expansion acceptably matched to alumina but not well-matched to beryllia, or barium titanate, other substrate materials of interest in the thick-film circuit art having especially low and high coefficients respectively.

Accordingly it is af urther object of the invention to provide compositions which may be fired to form conductive patterns which have low noise, good adherence and solderability and which have increased resistance to cracking under thermal stress.

Other objects and features of the invention will in part be obvious and in part be apprehended from the following description read in connection with the annexed drawings.

Figure 1:
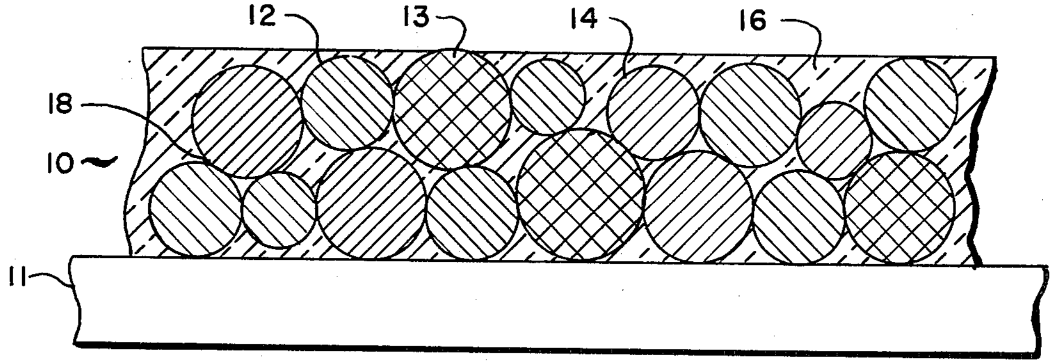
FIG. 1 is an exaggerated and magnified section through a prior-art palladium-silver-palladium oxide-glass resistor.

In FIG. 1 representing the prior-art, a resistor 10 fired on a substrate 11 is represented as comprising particles 12 of palladium metal and particles 13 of palladium oxide and particles 14 of silver metal embedded in a glass binder 16. The particles mixed together with a binder of finely ground powder of vitreous composition, termed a "frit," are dispersed in an organic vehicle which is evaporated after the composition is laid down on its substrate 11. The composition is then fired at a temperature which is above the softening temperature of the frit but below the melting point of the palladium and the silver. Under these circumstances a thin film of palladium oxides essentially PdO forms at the points of contact 18 between palladium particles and silver particles. This oxide forms in the temperature range of from 300° C. to 750° C. and above that temperature range the palladium oxide slowly reverts to palladium metal. It is a stable resistive material, and the resulting fired-on resistor may have various values depending upon the formulation of palladium oxide, palladium, silver and frit, and upon the firing cycle. Of significance here is the fact that the resistance of the junction points is much higher than the body resistance within either the palladium particles or the silver particles.

Figure 2:
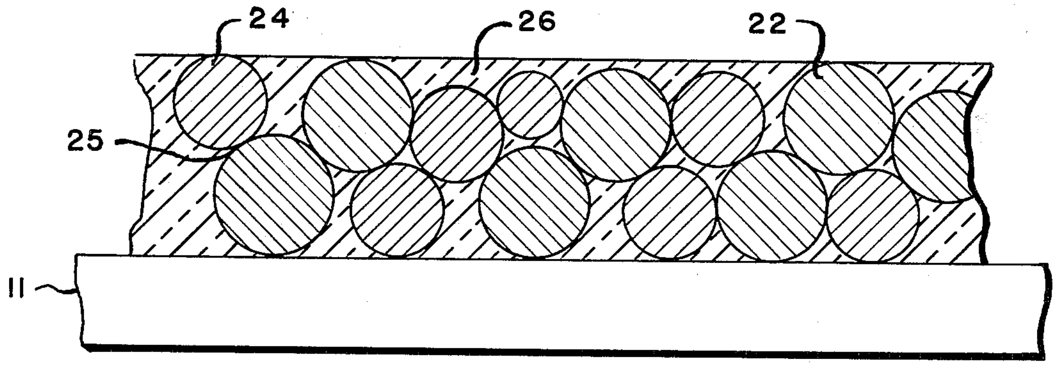
FIG. 2 is an exaggerated and magnified section through a prior-art palladium-gold-glass fired-on conductor.

In the configuration of FIG. 2, particles 22 of palladium metal and particles 24 of gold are embedded in a glass binder 26. Fired to the substrate 11 at a temperature below the melting point of the gold, surface and bulk diffusion take place at the particle contacts 25. These diffused regions are small in area, and, although relatively low in resistance, contribute substantially all of the resistance of the network of interconnected bodies. If one could hollow out each of the palladium and gold particles there would be very little change in the resistance.

Figure 3:
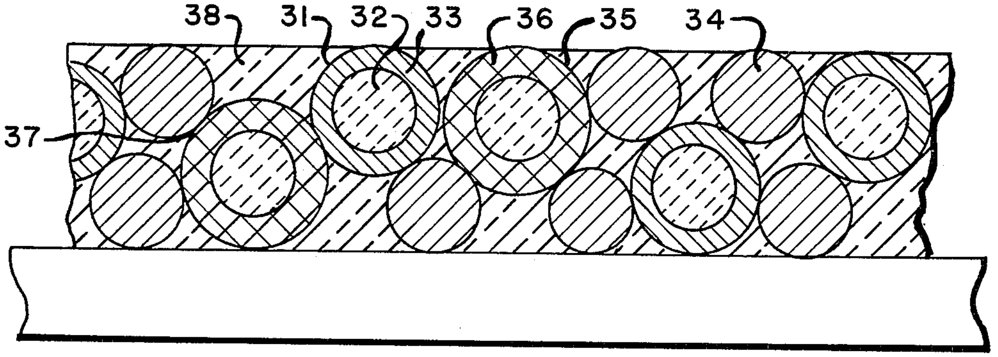
FIG. 3 is an exaggerated and magnified section through a structure of a palladium-silver-palladium oxide-glass conductor composition in accordance with the present invention.

While it is not practical to hollow-out the metal particles, it is practical to deposit palladium metal on uniformly sized small particles of alumina, for example. FIG. 3 illustrates the formation of a resistor employing such "mock palladium." Particles 31 of false palladium having cores 32 of alumina and skins 33 of palladium are mixed with and joined to particles 34 of silver. Also included are particles 35 of originally "mock palladium" and which prior to formulation are oxidized so that the skins 36 are essentially palladium oxide PdO. Resistive junctions 37 are formed between the particles, the whole being embedded in a glassy matrix 38.

Figure 4:
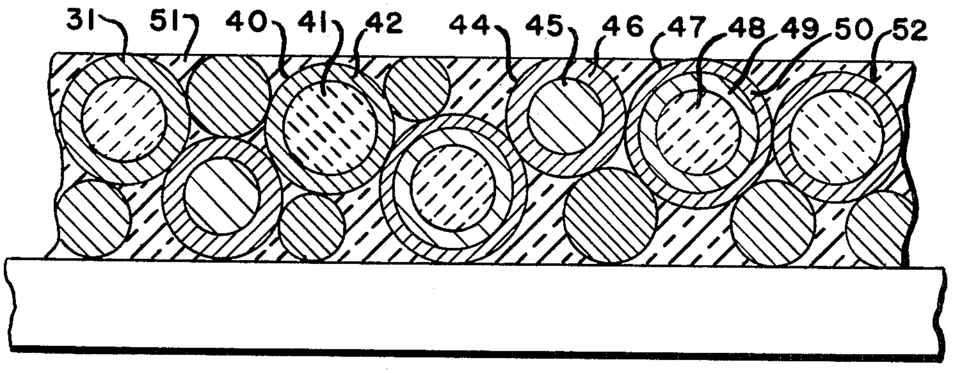
FIG. 4 is an exaggerated and magnified section through a palladium-gold fired-on conductor in accordance with the present invention.

The structure of FIG. 4 illustrates a highly conductive composition in which two kinds of mock palladium are blended with three kinds of mock gold to provide desired properties of thermal coefficient and solderability.

The particles 31 have cores of alumina and skins of palladium and the particles 40 have cores 41 of beryllia and skins 42 of palladium. The particles 44 have cores 45 of copper and skins 46 of gold. The particles 47 have inner cores 48 of ceramic dielectric intermediate layers 49 of copper, and skins 50 of gold. The whole is sintered together in a glassy matrix 51.

Upon sintering, low resistance bonds are formed between touching skins of gold and at points of contact between skins of gold and of palladium, while relatively high resistance connections result between adjacent palladium skins.

Since the object of resistor compositions is to provide stable high resistance, the false palladium with a nonconductive core (to the extent that this results in a higher resistance) is preferable to the solid palladium particles of the prior art. If desired, however, an alternative kind of mock palladium could be made by deposition of the palladium over a metallic core of, for example, nickel or copper. Where it is necessary to maintain a low coefficient of thermal expansion, cores of alumina or beryllia are preferred.

In the case of the "mock gold" it is preferred that the core be a solderable metal that does not melt at the sintering temperature, and it is preferably not silver because of the mentioned difficulties with that metal. Nickel and copper and alloys of these metals are preferred.

It has been found that the gold particles contribute to solderability of the completed conductor. If there is too little gold exposed at the surface of the conductor, it will be dissolved in the solder, and there will be poor adhesion if the core material underlying the gold skin, and which is exposed by the dissolution of gold, is not solderable. With respect to the copper-cored particles 44, however, the metal exposed by dissolution of gold into the solder is copper, and, thus, a smaller proportion of gold is required than would be required if the cores were alumina. Mock gold with a copper core has a thermal expansion about twice that of the preferred alumina substrate material. Pure gold also has a coefficient of thermal expansion that is greater than that of alumina. Since mock gold could make up nearly half of the volume of the completed conductor body, in such cases it may be difficult to compensate in the other constituents for an excessive expansion in the gold. Thermal stress is relieved by cold flow in the metal. When a better match is needed, gold having a much lower coefficient of expansion may be produced by using a core of beryllia and by blending with other particles. For example, the particles 47 are formed around inner cores 48 of beryllia particles typically quite uniformly sized at about 2 microns. Over these a layer of copper about half a micron thick is deposited, and then a layer of gold a few tenths of a micron thick. The composite particle is only about ¼ gold by volume and has a linear coefficient of thermal expansion approximating that of gold itself. As a further example, the particles 52 comprising a half micron gold skin over a two micron diameter beryllia core are only 50% fine gold but have a coefficient of expansion closely matching that of alumina.

It will be apparent from the foregoing that a myriad of different particles and proportions may be employed to produce compositions with various electrical conductivities, various coefficients of thermal expansion, and with various degrees of adhesion to various substrate materials. It will also be apparent that the operable proportions start with a certain minimum skin thickness and extend to any greater skin thickness, if the substrate is selected to be compatible with resulting coefficient of expansion. We have found that the volume percent of false gold and of false palladium required to achieve a given degree of solderability is greater than for particles of pure gold and palladium. Thus, particles which are 20% precious metal by volume are found to be only half as effective in promoting solderability. Instead of an apparent saving of 80% in precious metal content, in practice at the present state of the art, the saving may be only 60%.

Because materials which do not affect the conductivity of the fired conductor make up the greater part of the composition, and since these materials, making up core and binder, may be formulated and selected from metals or oxides which have either low or high densities, weight percentages are an unreliable guide to precious metal content in these compositions.

Since a given thickness of skin amounts to a greater proportion of the weight and volume of a small particle than of a large particle, a family of tricoordinate charts would be necessary to illustrate preferred and operable proportions. In the case of resistive compositions, such a family would be required for each value of resistivity. Under these circumstances such diagrams cease to be a guide to design.

For the conductive compositions, there would be a triaxial diagram for each selected mix of mock gold and a mock palladium in a conductor composition. From an examination of typical triaxial diagrams the trends with changes in particle size may be appreciated.

Figure 5:
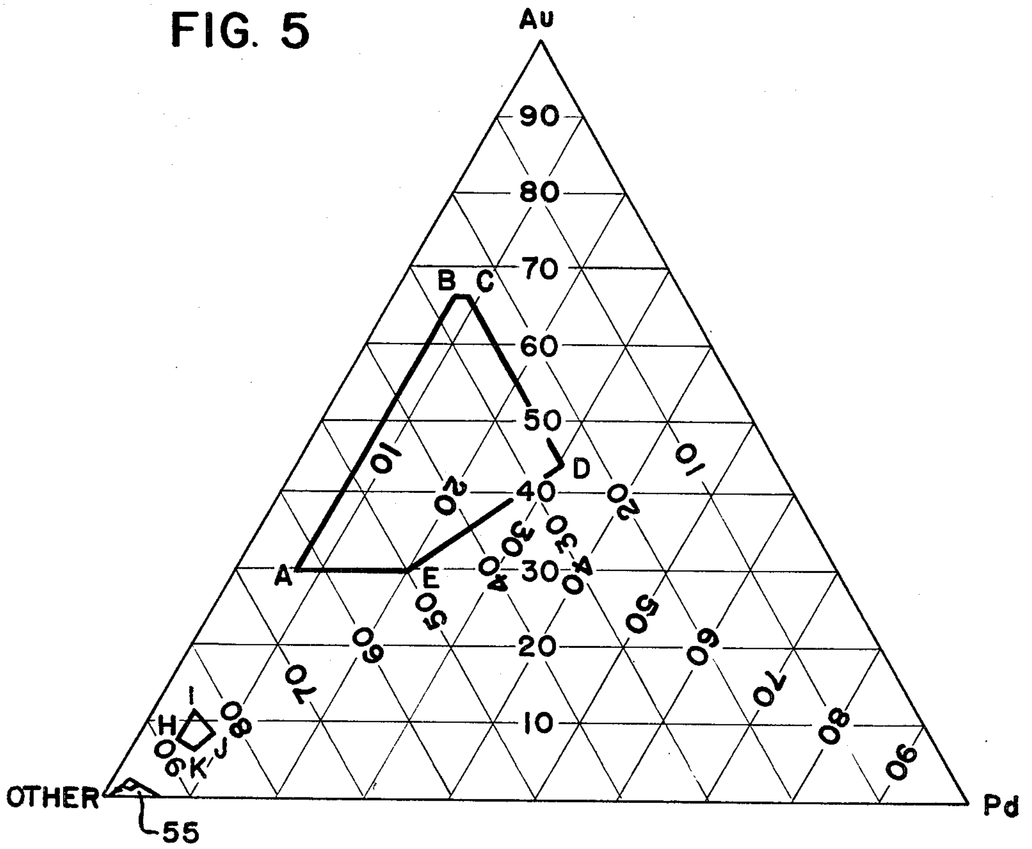
FIG. 5 is a triaxial diagram showing operable proportions for the system: palladium-gold-(other) for pure metal particles for "mock-metal" particles of large and small size in acordance with the present invention.

In FIG. 5 the ABCDE contour represents the operable proportions of compositions comprising palladium powder, gold powder, and matrix, as set forth in the patent to C. W. Wagner, U.S. Pat. No. 3,347,799. The segment AB prescribes the minimum proportion of palladium for contact with palladium-based resistors. The segment CD is the limit of binder composition, at least 25% by volume. The segment AE indicates the minimum gold proportion for good solderability, 30 percent by volume. The remaining major segment DC is the practical upper limit of palladium content, beyond which the resistivity rapidly increases beyond the practical limit for conductors of 0.1 ohm per square per mil thickness. Compositions having more palladium and less gold would be operable as resistor compositions but would not be solderable, and therefore not generally useful for interconnections.

The contour ABCDE may also be considered as limiting compositions of "mock palladium," "mock gold" and a binder, if the mock materials were 100% effective. For compositions in which mock gold and mock palladium substitute for all or some of the solid metal, the resulting volume percentages of palladium and of gold are substantially reduced. Two examples are plotted. In one, designated by the contour HIJK, the particles of mock gold are substantially of 0.6 micron diameter, of which the skin has a depth of 0.02 microns, and the particles are composed of, by volume, 19% gold and 81% copper; and the particles of false palladium are substantially of 0.3 micron diameter, with a skin of palladium also 0.02 micron thick, and these particles are composed of 35% palladium and 65% alumina by volume. These particles approach the smallest practical coated particles. For smaller particles, the saving in precious metal is less and the cost of production greater.

As an example of a composition with relatively large false particles, the contour PQRS (designated 55 in FIG. 5) indicates the proportions of precious metal when compounded with mock gold particles substantially six microns in diameter with a 0.05 micron skin and mock palladium particles nominally three microns in diameter also with a skin only a twentieth of a micron thick. These particles contain only 5% of gold and 10% of palladium respectively by volume.

Figure 6:
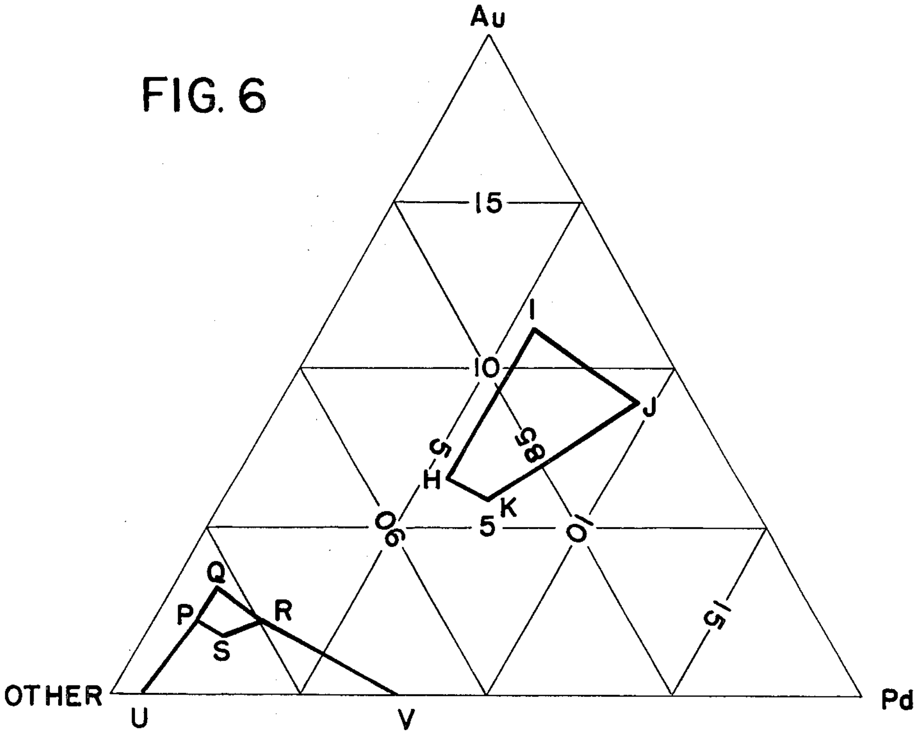
FIG. 6 is a magnified portion of the triaxial diagram of FIG. 5.

FIG. 6 is an amplified portion of FIG. 5 for compositions containing not more than 20% by volume of gold and palladium combined.

Figure 7:
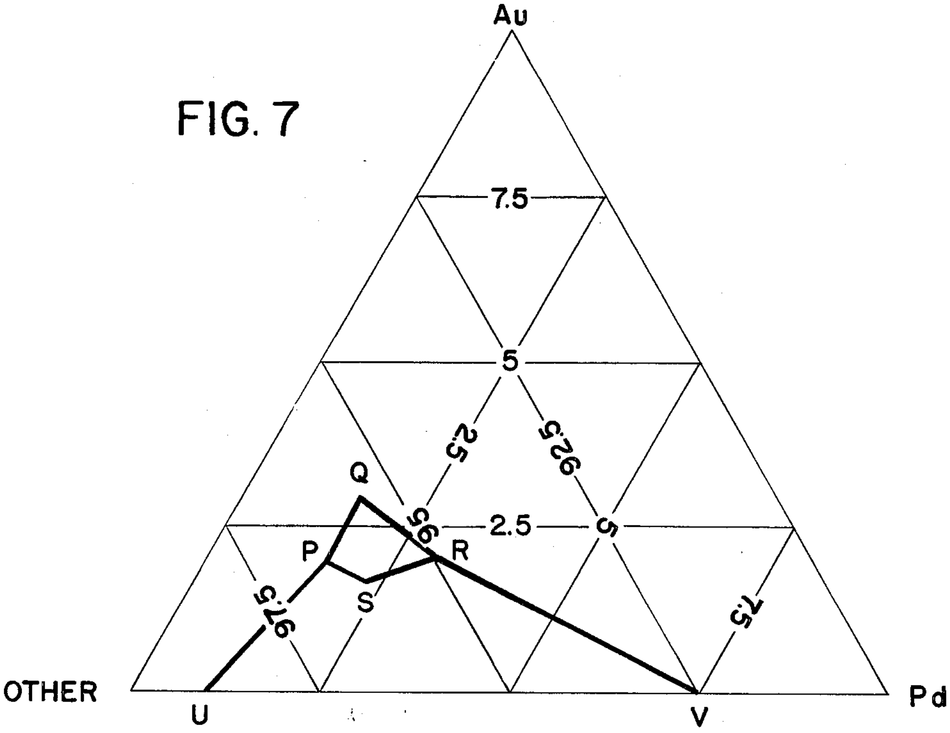
FIG. 7 is a still further magnified portion of the triaxial diagram of FIG. 5.

FIG. 7 is a further amplified portion of FIG. 5 for compositions containing not more than 10% by volume of gold and palladium combined. In addition to the contour PQRS for solderable compositions with resistivities less than 0.1 ohm per square per mil. The contour UPSRV bounds compositions having greater resistance and lacking the solderability of the compositions containing more mock gold. These compositions which may contain up to 75% by volume of mock palladium particles of 3 microns diameter, contain less than 7.5% by volume of palladium metal. The resulting resistivities depend both upon the composition and the firing schedule.

It is known that rhodium, like palladium, forms oxides on heating in air above about 300° C. with greatest weight gain in the neighborhood of 800° C.; and that upon heating to a higher temperature the oxide is reduced to the metal. It has been found that rhodium may be substituted for palladium on an equal-volume basis in making conductors and resistors of the above-described compositions.

Heretofore, because of the much greater cost of rhodium than of palladium, rhodium has not been a practical alternative to palladium. Rhodium is known for its capacity to form extremely thin, dense, corrosion resisting platings. Moreover, rhodium has a much higher melting point and much lower coefficient of thermal expansion (slightly less than that of platinum, slighlty greater than that of alumina) than palladium. Accordingly, it may be employed alone or in combination with other noble metals to form false rhodium powder having a very low proportion of rhodium. The cost of the metal then is not significantly (if at all) greater than the cost of the greater amount of other noble metals required to achieve the same result. Resistor compositions containing less than 2% by volume of the sum of rhodium palladium, gold, platinum, and silver and conductor compositions for connecting to them may effectively employ mock palladium powders.

FIGS. 5–7 show examples of operable proportions of palladium and gold for solid palladium and gold particles and for relatively large and relatively small mock palladium and mock gold particles. It will be apparent that by blending mock palladium particles and mock gold particles with various proportions of solid gold and solid palladium particles, resistor compositions can be made having from less than two percent to thirty percent palladium and from zero to 67% gold, all percents by volume. The range of operable proportions is seen to be greatly enlarged over the prior art.

Preparation of compositions of the type described involves preliminary preparation of coated particles of three types which are:

Type I, a coat of metal applied over an inert non-metallic core, for example palladium over alumina, Type II, a coating of a first metal desired for its surface properties over a second metal selected for its bulk properties, example, gold over copper, and Type III, a coating of metal desired for its surface properties over a Type I particle providing selected composite bulk properties.

The design of a system is simplified if plastic flow of some of the cores may be ignored. In the more popular formulations, the palladium particles are smaller. It is preferred that the mock palladium be Type I with a core that does not soften at the firing temperature. Glasses which do soften can be used in resistor compositions, but their tendency to bleed causes an increase in resistivity and reduction of solderability to be avoided in conductor compositions.

Coating Type I particles may be accomplished using organo-metallic compounds, such as liquid resinates as the source of skin metal. The core material may be a ceramic or a glass having appropriate properties. For example, an alumina powder supplied by Fisher Scientific Co. with an average particle size of five microns is reduced in a porcelain ball mill to an average particle size of 0.25 micron. Sixty-seven grams of this powder are dispersed in 500 grams of a palladium resinate preparation designated A–1122 as sold by Engelhard Industries, and containing 45 grams of palladium metal. The resinate in a porcelain crucible is placed on a hot plate and stirred with a propeller-type mixer with the propeller situated near the bottom of the crucible. While stirring at about 1000 r.p.m., the alumina is added slowly to insure complete de-agglomeration and setting of the particles. This is further insured by allowing the vigorous mixing action to continue for about half an hour. Then, the mixing speed is reduced to about 200 r.p.m. and the hot-plate is raised to a surface temperature of about 300° C. At this temperature, there is boiling with attendant gradual thickening of the mixture, until it "seizes" stopping the agitation. The resulting mass comprises a jelled solution with a uniform distribution of particles throughout the resinate which is not yet completely decomposed. Further heating in a well-ventilated furnace slowly brought up to a temperature of at least 425° C. completely burns out all carbonaceous matter and any remaining organic liquids, within a period of one to two hours. The residue is a soft mass of the desired Type I particles, individually coated with palladium. If held at the high temperature too long, or if the temperature is raised too high, say to 550° C., the particles will stick together. This must be avoided.

The finished coated powder has much the appearance and "feel" of solid palladium powder and is handled as is palladium powder in the prior art, taking into account that the density of the powder is significantly less than that of palladium.

Alloys as well as pure metals may be deposited in this way, for example an alloy 62.3% by weight palladium, 32% silver, and 5% gold has been deposited over a core of glass by mixing the resinates in appropriate proportions depending upon metal content. To 40% metal content resinate solution, 60% glass powder is added of composition: lead oxide 50% to 70%, silicon dioxide 12% to 24%, boric oxide 10% to 20%, aluminum oxide 1% to 3%, and cadmium oxide 3% to 10%. The resulting metal-alloy coated glass particles may be used for resistor formulations. A screened and fired resistor with an additional 15% glass matrix provides a resistivity of the order of 6000 ohms/square/mil, depending upon the firing schedule.

Type II particles are prepared by plating. In moderate quantities, electrodeless plating is preferred; but in larger quantities electroplating, while tumbling in a drum, may be more economical. A mock gold has been prepared, for example, starting with copper powder obtained from Fisher Scientific and designated C–431 electrolytic dust, having a particle size under 10 microns. 10 grams of the powder, screened with a 325 mesh screen to break up any clumps and to remove oversized particles, is stirred into 500 milliliters of "Oromerse" electrodeless gold solution at 70–75° C. for fifteen minutes, after which the reaction is stopped by filtering off the solution in a gooch vacuum filter. The resulting powder is 18% gold by weight. 'Oromerse" is a proprietary solution of gold cyanides produced by Technic Incorporated, Providence, R.I. Comparable results have been achieved with "Lectroless Gold" sold by Selrex Corporation, Nutley, N.J. and with "880 gold" sold by Service Chemical Corporation, North Andover, Mass. Since there is a considerable variation in size and shape of these particles, there is a corresponding variation in volume percentage of gold from particle to particle. 18 percent gold by weight corresponds to about 10% gold by volume. If the copper particles were uniformly 3 micron spheres, the coating would be less than a tenth of a micron thick.

Type III particles may be produced by combining selected processes for producing particles of Type I and II. A core of beryllia coated successively with copper and gold provides a mock gold matching real gold in thermal coefficient of expansion. Copper particles coated successively with nickel and gold or tungsten and gold will be more stable because of the lesser solubility of gold in tungsten and nickel.

It is preferred that particles of all types be prepared with core materials which are rounded and evenly sized. After coating, particles of various sizes may be blended for a particular use or composition. There is a large commercial capacity for producing glass and ceramic spheres and for sorting them by size; however, at the present time the scale of operations has not justified the preparation of special sized and shaped particles for these electrically conducting compositions. Performance may be extrapolated from experience with more broadly sized, rough particles.

PASTE PREPARATION

Once the coated particles have been prepared, they may be used to make thick-film pastes. The preparation of such pastes is well-known in the art. The following procedure is typical and is followed to prepare the preferred embodiment of conductor paste.

The powdered constituents are passed through a 325 mesh screen to remove any agglomerates that might interfere in later operations. The proportions of constituents by weight are:

| | Percent |
|---|---|
| Fine gold powder | 70.1 |
| Mock palladium | 19.9 |
| Glass flux | 10.0 |

The preferred glass composition is (by weight)

| | Percent |
|---|---|
| Bismuth oxide, $Bi_2O_3$ | 67 |
| Lead oxide, PbO | 20 |
| Silica, $SiO_2$ | 5.9 |
| Boric oxide, $B_2O_3$ | 5 |
| Cadmium oxide, CdO | 2 |
| Alumina, $Al_2O_3$ | 0.1 |

The mock palladium is of the 40% by weight palladium 60% alumina composition above-described. The indicated proportions of gold, mock palladium, and glass are placed in a drum or V-type blender, and mixed thoroughly. This step is important to disperse small agglomerates, which otherwise might survive later operations.

The blended powders are then combined with a sufficient quantity of a liquid vehicle to form a pasty mixture which may be squeezed through a screen stencil. The vehicle serves mainly to provide the appropriate consistency for screening but may also contain waxes, thermoplastic resins, and the like to provide a degree of green strength to the film after liquid vehicle components have been driven off. For this composition the preferred vehicle is ethyl cellulose 25%, butyl carbitol acetate 50%, and iso-pentyl salicylate 25% by weight, to form a paste with 75% solids.

The paste is preferably smoothed by several passes through a three-roll ink mill at mill-gaps approaching one mil on the final pass. Air is removed by evacuation.

This composition, screened through a 230 mesh screen onto an alumina substrate and fired at 875° C. peak with four minutes soak at that temperature, yields the following physical and electrical properties:

Adhesion: greater than 1,000 p.s.i.
Fired appearance: excellent, dense
Conductivity: 35–50 milliohms/square/mil
Solderability: satisfactory
Leach resistance to solder bath: fair.

The volume percentage composition of the resulting conductor composition is

Palladium: 7.3%
Gold: 40.0
Alumina core: 35.8
Glass matrix: 16.9

To achieve a comparable composition with palladium metal instead of mock palladium would require approximately 25% by volume palladium metal and 30% glass binder with 45% gold. Thus there is a saving of over 60% of the palladium metal.

At the present state of the art, substitution of mock gold for some or all of the fine gold is not preferred; however, in quantity production, mock gold would be substituted for fine gold.

Having thus described our invention, we claim:

1. A conductor composition for hybrid circuits, comprising by volume at least 15% mock palladium particles, said particles each of a size between 0.3 micron and 50 microns having a skin of precious metal from the group consisting essentially of palladium and rhodium and having a core not of precious metal composition and solid at the sintering temperature of said skin, the content of said precious metal in said composition being less than eight percent by weight and comprising golden particles of a size between 0.3 micron and 50 microns in an amount of at least 15% by volume, said golden particles comprising fine gold content not more than 65% of said composition by weight, said golden particles and mock palladium particles being imbedded in a glass binder comprising at least 12% of said composition by volume.

2. A conductor composition in accordance with claim 1 wherein said golden particles are mock gold particles constituting at least 30 percent by volume of said composition and comprise a skin of fine gold over a core of metal from the group consisting of copper, nickel, tungsten and alloys substantially of these.

3. A conductor composition in accordance with claim 1 wherein the weight percent of gold together with said precious metal does not exceed 60%.

4. A conductor composition in accordance with claim 3 wherein said golden particles are mock gold particles constituting at least 30 percent by volume of said composition and comprise a skin of fine gold over a core of metal from the group consisting of copper, nickel, tungsten and alloys substantially of these.

5. A conductor composition as defined by claim 1 wherein said cores are of a non-metal from the group consisting of beryllia, alumina, silica, thoria, titanium dioxide and zirconium dioxide and glass hard at the firing temperature between 750° C. and 1000° C.

6. A conductor composition as defined by claim 5 wherein said cores are smoothed and rounded as by fire-polishing.

7. A conductor composition as defined by claim 6 wherein said cores are spheres consisting essentially of a vitreous substance from the group consisting of fused silica and glass.

References Cited

UNITED STATES PATENTS

| | | | |
|---|---|---|---|
| 3,274,022 | 9/1966 | Rhoda | 117—227 |
| 3,347,799 | 10/1967 | Wagner | 117—227 |
| 3,440,062 | 4/1969 | Hoffman | 117—227 |

DOUGLAS J. DRUMMOND, Primary Examiner

U.S. Cl. X.R.

117—227

UNITED STATES PATENT OFFICE
CERTIFICATE OF CORRECTION

Patent No. 3,598,761 Dated August 10, 1971

Inventor(s) J. M. Woulbroun, etal.

It is certified that error appears in the above-identified patent and that said Letters Patent are hereby corrected as shown below:

Col. 2, line 63, "af urther" should be --a further--.

Col. 7, line 12, "too" should be --to--.

Signed and sealed this 21st day of May 1974.

(SEAL)
Attest:

EDWARD M.FLETCHER,JR.
Attesting Officer

C. MARSHALL DANN
Commissioner of Patents

FORM PO-1050 (10-69)

USCOMM-DC 60376-P69
☆ U.S. GOVERNMENT PRINTING OFFICE : 1969 O—366-334.